(12) United States Patent
Shiragami et al.

(10) Patent No.: US 11,482,144 B2
(45) Date of Patent: Oct. 25, 2022

(54) DISPLAY DEVICE INCLUDING COUPLING ARRANGEMENT OF SWITCHES AND DRIVER TERMINALS

(71) Applicant: Japan Display Inc., Tokyo (JP)

(72) Inventors: Kengo Shiragami, Minato-ku (JP);
Keita Sasanuma, Minato-ku (JP);
Naoyuki Obinata, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/468,417

(22) Filed: Sep. 7, 2021

(65) Prior Publication Data

US 2021/0407350 A1 Dec. 30, 2021

Related U.S. Application Data

(63) Continuation of application No. PCT/JP2020/002396, filed on Jan. 23, 2020.

(30) Foreign Application Priority Data

Mar. 18, 2019 (JP) .............................. JP2019-050334

(51) Int. Cl.
*G09G 3/00* (2006.01)
*G09G 3/36* (2006.01)
(Continued)

(52) U.S. Cl.
CPC ......... *G09G 3/006* (2013.01); *G02F 1/13452* (2013.01); *G09G 3/3648* (2013.01);
(Continued)

(58) Field of Classification Search
CPC ................. G09G 3/006; G09G 3/3648; G09G 2300/0426; G09G 2320/043;
(Continued)

(56) References Cited

U.S. PATENT DOCUMENTS 5,585,815 A * 12/1996 Nakashima ........... G02F 1/1362
345/206
2018/0321766 A1* 11/2018 Akimoto ............. G06F 3/04166

FOREIGN PATENT DOCUMENTS

CN 103186000 * 7/2013 ............. G09G 3/006
JP 3-18891 A 1/1991
(Continued)

OTHER PUBLICATIONS

International Search Report dated Apr. 7, 2020 in PCT/JP2020/002396, filed on Jan. 23, 2020, 2 pages.

*Primary Examiner* — Kwang-Su Yang
(74) *Attorney, Agent, or Firm* — Maier & Maier, PLLC

(57) ABSTRACT

A display device includes a first substrate having a display area in which pixels are arranged and a peripheral area; wiring provided in the display area and coupled to the pixels to supply a signal; a first terminal and a second terminal, provided in the peripheral area; a driver terminal provided in a first peripheral area on a first direction side of the display area, and coupled to the wiring to allow a driver IC to be coupled to the driver; a first switch provided in the first peripheral area closer to the display area than the driver terminal to switch between coupling and decoupling between the first terminal and the wiring; and a second switch provided in a second peripheral area on a second direction side in a direction opposite to the first direction, and coupled to the second terminal and the wiring.

7 Claims, 9 Drawing Sheets

(51) Int. Cl.
*H01L 27/12* (2006.01)
*G02F 1/1345* (2006.01)

(52) U.S. Cl.
CPC . *H01L 27/1244* (2013.01); *G09G 2300/0426* (2013.01); *G09G 2300/0809* (2013.01); *G09G 2320/043* (2013.01); *G09G 2330/12* (2013.01)

(58) Field of Classification Search
CPC ........ G09G 2330/12; G09G 2300/0809; H01L 27/1244; G02F 1/13452
See application file for complete search history.

(56) References Cited

FOREIGN PATENT DOCUMENTS

| | | |
|---|---|---|
| JP | 2003-29296 A | 1/2003 |
| JP | 2010-243524 A | 10/2010 |

\* cited by examiner

DISPLAY DEVICE INCLUDING COUPLING ARRANGEMENT OF SWITCHES AND DRIVER TERMINALS

CROSS-REFERENCE TO RELATED APPLICATION

This application claims the benefit of priority from Japanese Patent Application No. 2019-050334 filed on Mar. 18, 2019, and International Patent Application No. PCT/JP2020/002396 filed on Jan. 23, 2020, the entire contents of which are incorporated herein by reference.

BACKGROUND

1. Technical Field

What is disclosed herein relates to a display device.

2. Description of the Related Art

Various technologies for inspecting display devices have been developed to ensure the reliability of display devices. For example, Japanese Patent Application Laid-open Publication No. 2010-243524 (JP-A-2010-243524) discloses a technology in which an inspection terminal to be coupled to a signal line, which is coupled to pixels, is provided in a display device. According to JP-A-2010-243524, the colors of pixels are inspected by supplying an inspection data signal from the inspection terminal, and by causing pixels to create colors according to the inspection data signal.

In recent years, with higher definition of display devices, the number of wiring lines tends to be increased, and the thickness of each of the wiring lines tends to be narrowed. Thus, wiring with a locally narrowed line width has been manufactured. In such a display device, when a drive current flows through the wiring for a long period of time with the lapse of drive time, the location where the line width of the wiring is locally narrowed may be disconnected, due to the stress from the drive current. There is also a demand for detecting a location where disconnection may occur or where disconnection has occurred, in addition to detecting a location where the line width is locally narrowed as described above. Thus, suppressing deterioration in reliability is required by making it possible to detect a location where disconnection may occur and the like.

Accordingly, there is a need for a display device capable of suppressing deterioration in reliability.

SUMMARY

A display device according to one aspect of the present invention includes a first substrate having a display area in which a plurality of pixels are arranged and a peripheral area outside of the display area; wiring provided in the display area and coupled to the pixels to supply a signal to the pixels; a first terminal and a second terminal, provided in the peripheral area; a driver terminal provided in a first peripheral area that is the peripheral area on a first direction side of the display area, and coupled to the wiring to allow a driver IC to be coupled to the driver; a first switch provided in the first peripheral area closer to the display area than the driver terminal, the first switch being configured to switch between coupling and decoupling between the first terminal and the wiring; and a second switch provided in a second peripheral area that is the peripheral area on a second direction side in a direction opposite to the first direction of the display area, and coupled to the second terminal and the wiring.

DETAILED DESCRIPTION

Figure 1:
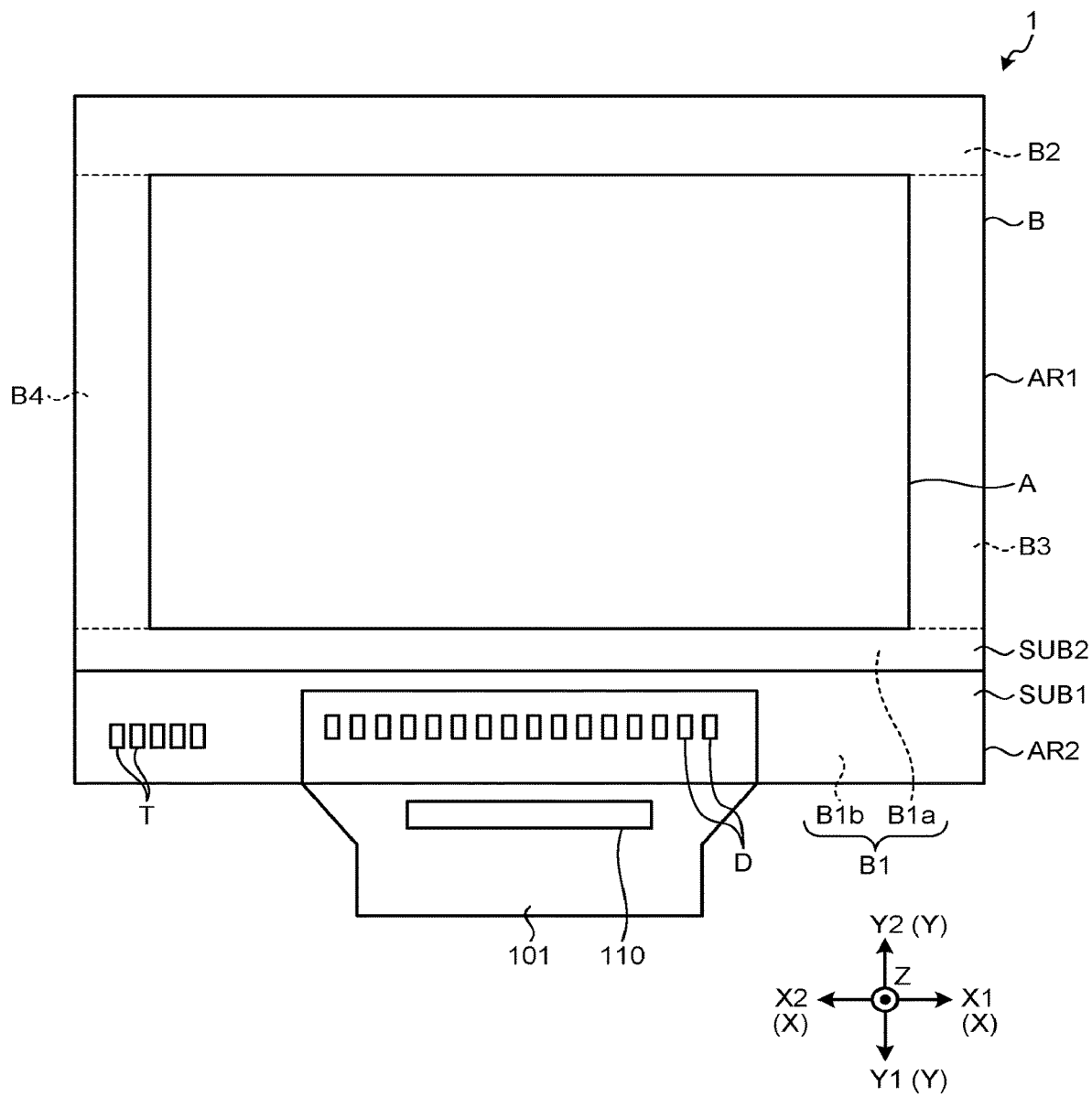
FIG. 1 is a plan view schematically illustrating a display device according to the present embodiment.

Hereinafter, embodiments of the present invention will be described in detail with reference to the accompanying drawings. What is disclosed herein is merely an example, and the present invention naturally encompasses an appropriate modification maintaining the gist of the invention that is easily conceivable by those skilled in the art. To further clarify the description, a width, a thickness, a shape, and the like of each component may be schematically illustrated in the drawings as compared with an actual aspect. However, this is merely an example and interpretation of the present invention is not limited thereto. The same element as that described in the drawing that has already been discussed is denoted by the same reference numeral throughout the present specification and the drawings, and detailed description may be omitted as appropriate.

Configuration of Display Device

FIG. 1 is a plan view schematically illustrating a display device according to the present embodiment. As illustrated in FIG. 1, a display device 1 according to the present embodiment includes a first substrate SUB1, which is an array substrate, and a second substrate SUB2, which is a counter substrate. Hereinafter, a direction X is a direction parallel to the surfaces of the first substrate SUB1 and the second substrate SUB2. A direction Y is a direction parallel to the surfaces of the first substrate SUB1 and the second substrate SUB2, and is a direction intersecting with the direction X, that is, in this example, a direction orthogonal to the direction X. A first direction Y1 is a direction toward one side in the direction Y, and a second direction Y2 is a direction toward the other side in the direction Y, that is, a direction opposite to the first direction Y1. Similarly, a third direction X1 is a direction toward one side in the direction X, and a fourth direction X2 is a direction toward the other side in the direction X, that is, a direction opposite to the third direction X1. A direction Z is a direction orthogonal to the direction X and the direction Y, that is, a direction orthogonal to the surfaces of the first substrate SUB1 and the second substrate SUB2.

The first substrate SUB1 and the second substrate SUB2 are layered in the direction Z. The first substrate SUB1 has a larger area than the second substrate SUB2. When viewed from the direction Z, a portion of the first substrate SUB1 on the first direction Y1 side is layered so as to protrude toward the first direction Y1 side from the second substrate SUB2. That is, the display device 1 includes an overlapping area AR1 in which the first substrate SUB1 and the second substrate SUB2 are overlapped with each other, and a projection area AR2 in which only the first substrate SUB1 is provided but not the second substrate SUB2. The projection area AR2 is adjacent to the overlapping area AR1 on the first direction Y1 side.

The display device 1 includes a display area A and a peripheral area B. The display area A is an area where a plurality of pixels are arranged and where an image is displayed. The peripheral area B is an area where pixels are not arranged and where an image is not displayed. The peripheral area B is an area outside of the display area A, when viewed from the Z direction. In the present embodiment, the peripheral area B is formed in a frame-shape surrounding the display area A, and may be referred to as a frame area. The display area A is provided in the overlapping area AR1 where the first substrate SUB1 and the second substrate SUB2 are overlapped with each other. The peripheral area B is an area in the first substrate SUB1. More specifically, a part of the peripheral area B is provided in the overlapping area AR1, and the other part of the peripheral area B is provided in the projection area AR2. That is, the peripheral area B is provided across the overlapping area AR1 and the projection area AR2. Thus, the first substrate SUB1 includes the display area A and the peripheral area B. More specifically, it can be said that the first substrate SUB1 is divided into the display area A and the peripheral area B.

The peripheral area B includes a first peripheral area B1, a second peripheral area B2, a third peripheral area B3, and a fourth peripheral area B4. The first peripheral area B1 is the peripheral area B on the first direction Y1 side of the display area A. The second peripheral area B2 is the peripheral area B on the second direction Y2 side of the display area A. In other words, the second peripheral area B2 is the peripheral area B on the side opposite to the first peripheral area B1 with the display area A interposed therebetween. The third peripheral area B3 is the peripheral area B on the third direction X1 side of the display area A. The fourth peripheral area B4 is the peripheral area B on the fourth direction X2 side of the display area A. In other words, the fourth peripheral area B4 is the peripheral area B on the side opposite to the third peripheral area B3 with the display area A interposed therebetween.

The first peripheral area B1 is provided across the overlapping area AR1 and the projection area AR2 on the first direction Y1 side from the overlapping area AR1. That is, the first peripheral area B1 includes an inner peripheral area B1a placed in the overlapping area AR1, and an outer peripheral area B1b placed in the projection area AR2. The second peripheral area B2, the third peripheral area B3, and the fourth peripheral area B4 are placed in the overlapping area AR1. That is, the overlapping area AR1 is occupied by the display area A, the inner peripheral area B1a, the second peripheral area B2, the third peripheral area B3, and the fourth peripheral area B4. The projection area AR2 is occupied by the outer peripheral area B1b.

A wiring substrate 101 is provided in the outer peripheral area B1b of the first peripheral area B1. For example, the wiring substrate 101 is configured of a flexible printed circuit (FPC). A driver integrated circuit (IC) 110 is provided on the wiring substrate 101. The driver IC 110 includes a control circuit that controls display of the display device 1, a detection circuit, an analog front end, and the like. The display device 1 only needs to be coupled to the wiring substrate 101 and the driver IC 110, and may not include the wiring substrate 101 and the driver IC 110. The display device 1 may also include the wiring substrate 101 and the driver IC 110. In the example of FIG. 1, the display device 1 has a chip-on-film (COF) structure in which the driver IC 110 is mounted on the wiring substrate 101, which is the FPC. However, it is not limited thereto, and for example, the display device 1 may have a chip-on-glass (COG) structure in which the driver IC 110 is mounted on the projection area AR2.

The display device 1 further includes a plurality of driver terminals D provided in the peripheral area B, and a plurality of inspection terminals T provided in the peripheral area B. In the present embodiment, the driver terminals D and the inspection terminals T are provided in the first peripheral area B1, and more specifically, are provided in the outer peripheral area B1b of the first peripheral area B1. In the example of FIG. 1, the inspection terminals T are provided on the fourth direction X2 side of the driver terminals D. However, it is not limited thereto.

The driver terminals D are terminals that can be coupled to the driver IC 110. Each of the driver terminals D is a terminal for supplying various signals output from the coupled driver IC 110 to the wiring of the display device 1. Each of the inspection terminals T is a terminal for inspecting wiring, and in this example, is a terminal for performing an aging treatment. The aging treatment will be described below.

Figure 2:
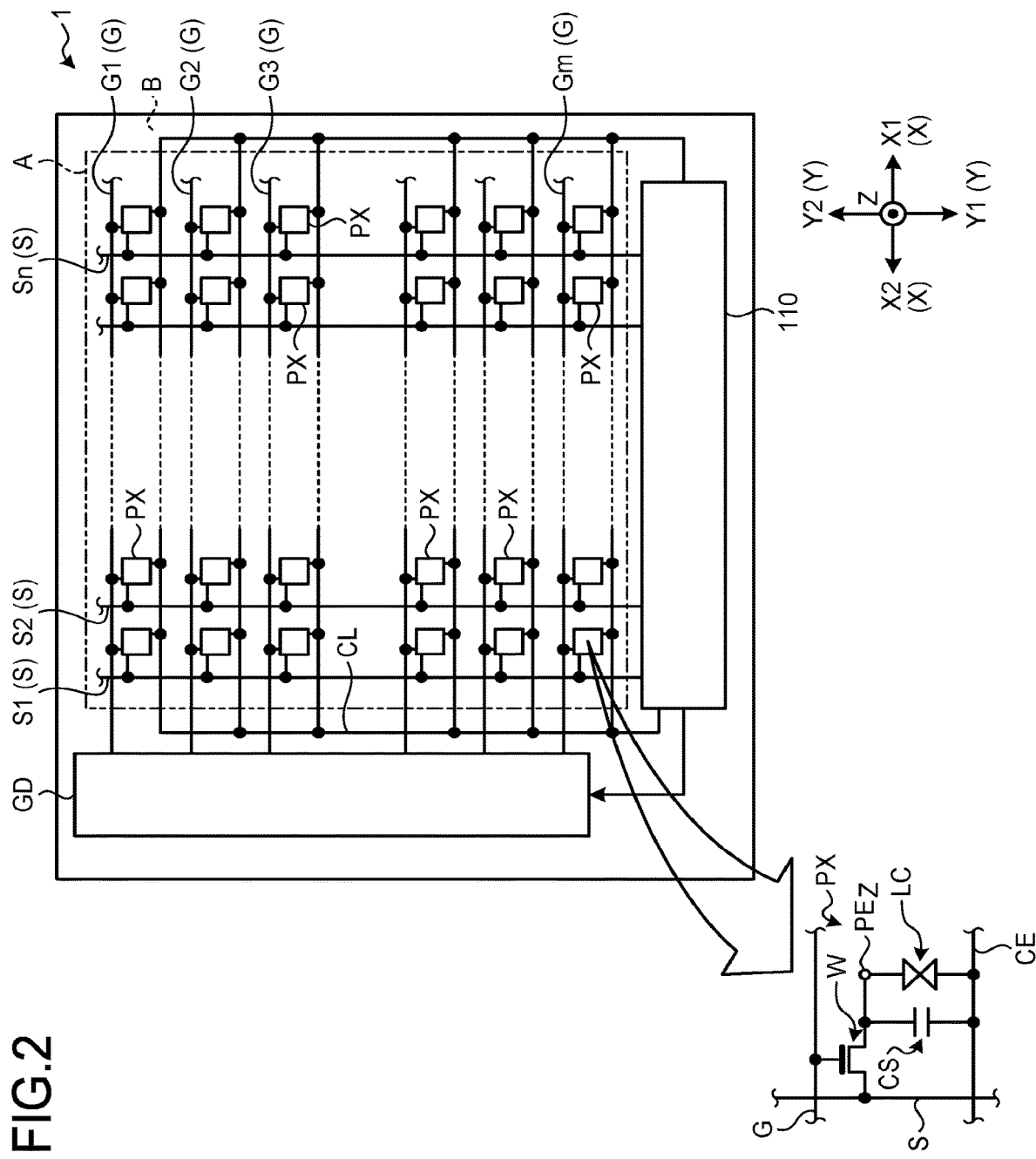
FIG. 2 is a schematic diagram illustrating a pixel array of the display device according to the present embodiment.

FIG. 2 is a schematic diagram illustrating a pixel array of the display device according to the present embodiment. As illustrated in FIG. 2, in the display area A, the display device 1 includes a plurality of pixels PX. The pixels PX are aligned in a matrix (row-column configuration) in the direction X and the direction Y. In the display area A, the display device 1 includes a plurality of wiring lines. As the wiring provided in the display area A, the display device 1 includes m pieces of scanning lines G (G1 to Gm), n pieces of signal lines S (S1 to Sn), and a common line CL. It should be noted that m and n are both integers equal to or greater than two. Each of the scanning lines G is coupled to a gate driver GD. A signal required for operating the gate driver GD is supplied from the driver IC 110. The signal lines S and the common line CL are coupled to the driver IC 110. The scanning lines G, the gate driver GD, the signal lines S, and the common line CL are formed on the first substrate SUB1 illustrated in FIG. 1.

Each of the pixels PX includes a switching element W, a pixel electrode PE, a common electrode CE, and a liquid crystal layer LC. For example, the switching element W is configured of a thin film transistor (TFT), and is electrically coupled to the scanning line G and the signal line S. The pixel electrode PE is electrically coupled to the switching element W. The common electrode CE is electrically coupled to the common line CL.

The gate driver GD outputs a control signal that brings the switching element W coupled to the scanning line G into a conducting state, to the scanning lines G. While the switching element W is in a conducting state, the driver IC 110 outputs a video signal to the signal lines S. Consequently, a desired pixel potential is written to the pixel electrode PE. The driver IC 110 also supplies a common potential to the common line CL. Consequently, the common electrode CE will have a common potential. In each pixel PX, each pixel electrode PE faces the common electrode CE, and the liquid crystal layer LC is driven by an electric field generated by a potential difference between the pixel potential of the pixel electrode PE and the common potential of the common electrode CE. For example, a holding capacitor CS is formed between an electrode having the same potential as the common electrode CE, and an electrode having the same potential as the pixel electrode PE.

Figure 3:
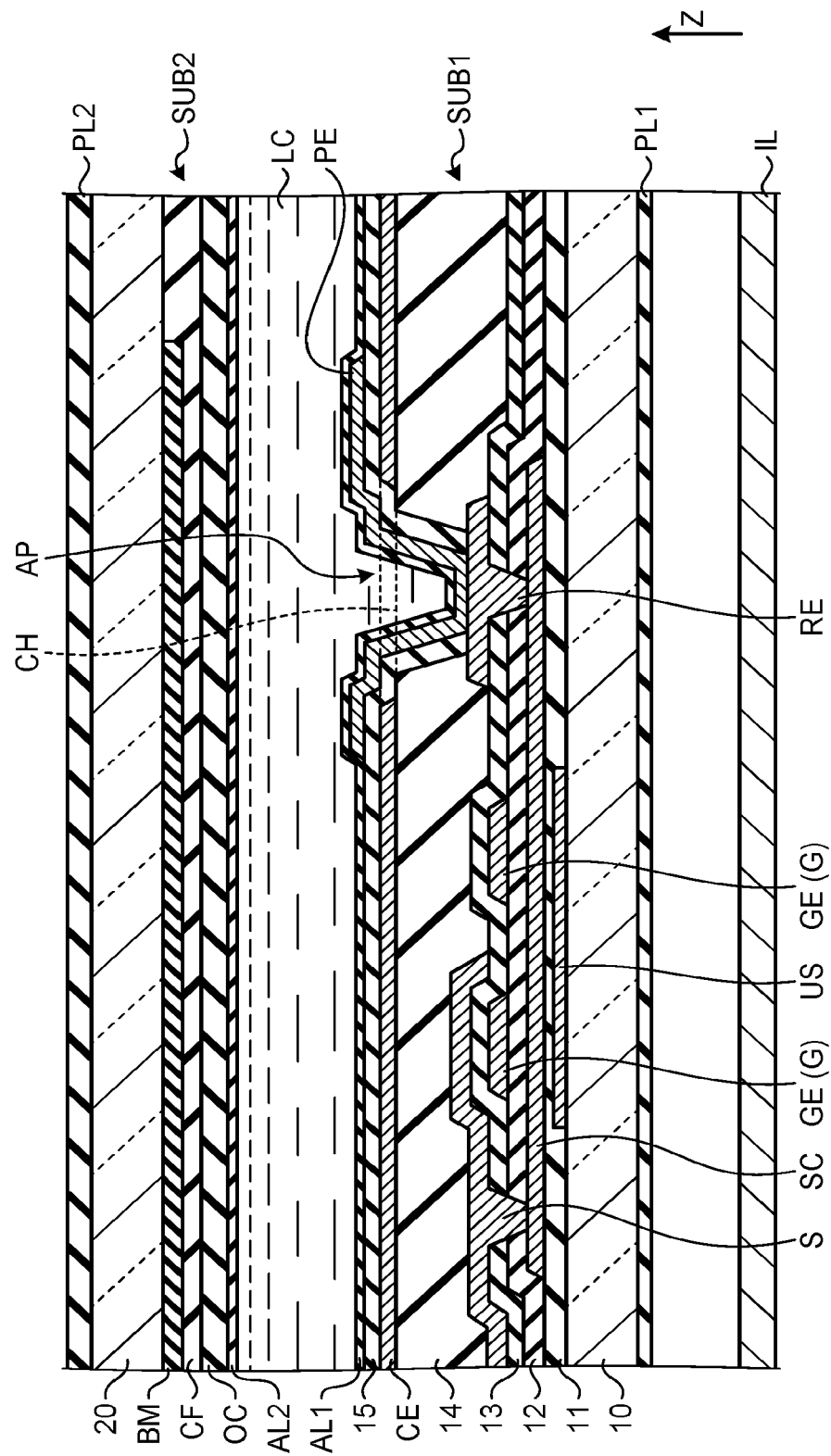
FIG. 3 is a schematic sectional view of the display device according to the present embodiment.

FIG. 3 is a schematic sectional view of the display device according to the present embodiment. As illustrated in FIG. 3, in the display device 1, the first substrate SUB1 and the second substrate SUB2 are layered in the direction Z. The first substrate SUB1 includes an insulating substrate 10, an insulating layers 11, 12, 13, 14, and 15, a lower-side light shielding layer US, a semiconductor layer SC, the scanning line G, the signal line S, a coupling electrode RE, the common electrode CE, the pixel electrode PE, and an orientation film AL1. The insulating substrate 10 is a transparent substrate such as a glass substrate and a resin substrate. The lower-side light shielding layer US is placed between the insulating substrate 10 and the insulating layer 11. In the example of FIG. 3, the lower-side light shielding layer US is formed so as to overlap across both gate electrodes. However, the lower-side light shielding layer US may be separately formed for each gate electrode. The semiconductor layer SC is placed between the insulating layer 11 and the insulating layer 12. For example, the semiconductor layer SC is formed of polycrystalline silicon, but may also be formed of amorphous silicon and an oxide semiconductor. Two gate electrodes GE, which are a part of the scanning line G, are placed between the insulating layer 12 and the insulating layer 13. The signal line S and the coupling electrode RE are placed between the insulating layer 13 and the insulating layer 14. The signal line S and the coupling electrode RE are each brought into contact with the semiconductor layer SC. The common electrode CE is placed between the insulating layer 14 and the insulating layer 15. The pixel electrode PE is placed between the insulating layer 15 and the orientation film AL1. A part of the pixel electrode PE faces the common electrode CE via the insulating layer 15. The common electrode CE and the pixel electrode PE are formed of a conductive material having translucency such as indium tin oxide (ITO) and indium zinc oxide (IZO). On a portion overlapping with an opening part AP of the common electrode CE, the pixel electrode PE comes into contact with the coupling electrode RE via a contact hole CH that penetrates through the insulating layers 14 and 15. The insulating layers 11 to 13, and the insulating layer 15 are transparent inorganic insulating layers such as silicon oxide, silicon nitride, and silicon oxynitride, and may have a single layer structure or a multilayered structure. The insulating layer 14 is a transparent organic insulating layer such as acrylic resin.

The second substrate SUB2 includes an insulating substrate 20, a light shielding layer BM, a color filter layer CF, an overcoat layer OC, and an orientation film AL2. The insulating substrate 20 is a transparent substrate such as a glass substrate and a resin substrate. The light shielding layer BM and the color filter layer CF are placed between the insulating substrate 20 and the overcoat layer OC. The orientation film AL2 covers the overcoat layer OC.

The liquid crystal layer LC is placed between the first substrate SUB1 and the second substrate SUB2, and is held between the orientation film AL1 and the orientation film AL2. The liquid crystal layer LC is configured of a positive type liquid crystal material (positive dielectric anisotropy) or a negative type liquid crystal material (negative dielectric anisotropy). A polarizing plate PL1 is disposed below the first substrate SUB1 (the side opposite to the second substrate SUB2). A polarizing plate PL2 is disposed above the second substrate SUB2 (the side opposite to the first substrate SUB1). In addition to the polarizing plates PL1 and PL2, a phase difference plate, a scattering layer, an antireflection layer, and the like may also be included according to the needs. An illumination device IL is placed below the polarizing plate PL1 (the side opposite to the first substrate SUB1).

In this manner, in the example of FIG. 3, the display device 1 is a liquid crystal display device in a lateral electric field mode, more specifically, in a fringe field switching (FFS) mode. However, the display device 1 may also be any display device such as a display device in a vertical electric field mode, in addition to the FFS mode.

The display device 1 performs an aging treatment for inspecting wiring. The aging treatment is performed before the display device 1 is shipped. The aging treatment detects a fault in the wiring in advance, by causing a current to flow through the wiring, and disconnecting the location where the line width of the wiring is locally narrowed. Hereinafter, a configuration for performing the aging treatment will be described.

Figure 4:
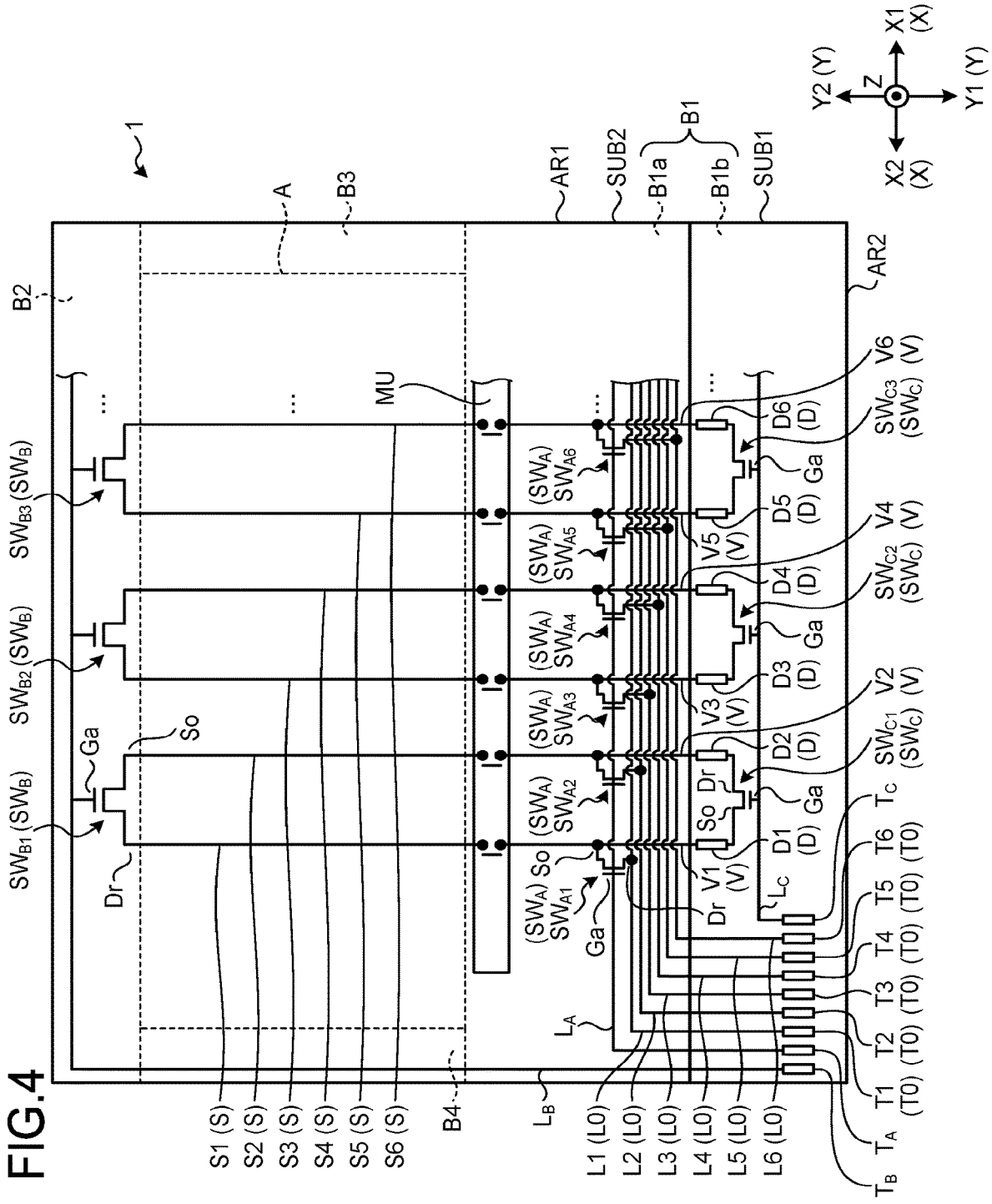
FIG. 4 is a schematic diagram of a configuration of the display device according to the present embodiment.

FIG. 4 is a schematic diagram of a configuration of the display device according to the present embodiment. As illustrated in FIG. 4, the driver terminal D in the display device 1 is coupled to a video line V, which is wiring, and the signal line S, which is wiring, via a coupling circuit MU. In FIG. 4, for the sake of convenience of explanation, two driver terminals D1 and D2 are illustrated as the driver terminals D. However, in practice, the number of the driver terminals D may be more than two. The driver terminal D1 is coupled to the coupling circuit MU via a video line V1. The driver terminal D2 is coupled to the coupling circuit MU via a video line V2. A driver terminal D3 is coupled to the coupling circuit MU via a video line V3. A driver terminal D4 is coupled to the coupling circuit MU via a video line V4. A driver terminal D5 is coupled to the coupling circuit MU via a video line V5. A driver terminal D6 is coupled to the coupling circuit MU via a video line V6. The coupling circuit MU is provided on the second direction Y2 side of the driver terminal D, and is placed in the inner peripheral area B1a of the first peripheral area B1. Thus, the video line V is provided across the outer peripheral area B1b on the driver terminal D side and the inner peripheral area B1a on the coupling circuit MU side.

The coupling circuit MU is coupled to the video line V and the signal line S, and switches the coupling between the video line V and the signal line S. More specifically, the coupling wiring MU couples at least one signal line S selected from the signal lines S and the video line V. In the present embodiment, the coupling circuit MU couples the signal line S1 with respect to the video line V1, that is, the driver terminal D1. The coupling circuit MU also couples the signal line S2 with respect to the video line V2, that is, the driver terminal D2. Similarly, the coupling circuit MU couples the video line V3 (driver terminal D3) and the signal line S3, couples the video line V4 (driver terminal D4) and the signal line S4, couples the video line V5 (driver terminal D5) and the signal line S5, and couples the video line V6 (driver terminal D6) and the signal line S6. In the example illustrated in FIG. 4, for the sake of convenience of explanation, the video lines V1 to V6 are illustrated as the video lines V. However, the number of the video lines V is not limited to six.

In this manner, in the display device 1, the driver terminal D is coupled to the signal line S via the video line V and the coupling circuit MU. Thus, when a signal is output from the driver IC 110 while the driver terminal D is coupled to the driver IC 110, the signal from the driver IC 110 is output to the signal line S via the driver terminal D, the video line V, and the coupling circuit MU, as a video signal.

The display device 1 includes a first switch $SW_A$, a second switch $SW_B$, and a third switch $SW_C$ in the first substrate SUB1. The first switch $SW_A$, the second switch $SW_B$, and the third switch $SW_C$ are switching elements, and in this example, are transistors. The display device 1 also includes switch terminals $T_A$, $T_B$, and $T_C$, and output terminals T1, T2, T3, T4, T5, and T6, as the inspection terminals T. The switch terminals $T_A$, $T_B$, and $T_C$ are terminals for outputting a gate signal to the first switch $SW_A$, the second switch $SW_B$, and the third switch $SW_B$. The output terminals T1, T2, T3, T4, T5, and T6 are terminals for outputting current for the aging treatment to the signal line S. The number of output terminals T1, T2, T3, T4, T5, and T6 is not limited to six, and may be any number.

The output terminals T1, T2, T3, T4, T5, and T6 each serving as a first terminal are coupled to coupling lines L1, L2, L3, L4, L5, and L6, each of which is wiring. The coupling lines L1, L2, L3, L4, L5, and L6 extend from a location in the outer peripheral area B1b coupled to the output terminals T1, T2, T3, T4, T5, and T6, to the inner peripheral area B1a, and extends in the third direction X1 in the inner peripheral area B1a. Hereinafter, if the output terminals T1, T2, T3, T4, T5, and T6 need not be distinguished from each other, the output terminals T1, T2, T3, T4, T5, and T6 are referred to as an output terminal T0. If the coupling lines L1, L2, L3, L4, L5, and L6 need not be distinguished from each other, the coupling lines L1, L2, L3, L4, L5, and L6 are referred to as a coupling line L0. That is, it can be said that the output terminal T0 is coupled to the coupling line L0.

The first switch $SW_A$ is provided in the first peripheral area B1, and is provided closer to the display area A (the second direction Y2 side of the driver terminal D) than the driver terminal D, in the first peripheral area B1. In the present embodiment, the first switch $SW_A$ is provided in the inner peripheral area B1a. More specifically, in the inner peripheral area B1a where the first substrate SUB1 and the second substrate SUB2 are overlapped with each other, the first switch $SW_A$ may be provided on a portion overlapping with the color filter layer CF, when viewed from the direction Z. The first switch $SW_A$ is coupled to the coupling line L0 and the video line V. That is, the first switch $SW_A$ is coupled to the output terminal T0 via the coupling line L0. The first switch $SW_A$ is coupled to the signal line S via the video line V. It can also be said that the first switch $SW_A$ is coupled to the driver terminal D via the video line V. More particularly, in the first switch SWA, a drain electrode Dr is coupled to the output terminal T0 via the coupling line L0. In the first switch $SW_A$, a source electrode So is coupled to the signal line S and the driver terminal D via the video line V.

A plurality of first switches $SW_A$ are provided, and in the example of FIG. 4, there are first switches $SW_{A1}$, $SW_{A2}$, $SW_{A3}$, $SW_{A4}$, $SW_{A5}$, and $SW_{A6}$. In the first switch $SW_{A1}$, the drain electrode Dr is coupled to the coupling line L1, and the source electrode So is coupled to the video line V1. In the first switch $SW_{A2}$, the drain electrode Dr is coupled to the coupling line L2, and the source electrode So is coupled to the video line V2. In the first switch $SW_{A3}$, the drain electrode Dr is coupled to the coupling line L3, and the source electrode So is coupled to the video line V3. In the first switch $SW_{A4}$, the drain electrode Dr is coupled to the coupling line L4, and the source electrode So is coupled to the video line V4. In the first switch $SW_{A5}$, the drain electrode Dr is coupled to the coupling line L5, and the source electrode So is coupled to the video line V5. In the first switch $SW_{A6}$, the drain electrode Dr is coupled to the coupling line L6, and the source electrode So is coupled to the video line V6. That is, in the first switch $SW_A$, the drain electrode Dr is coupled to one of the coupling lines L1, L2, L3, L4, L5, and L6, and the source electrode So is coupled to one of the video lines V1, V2, V3, V4, V5, and V6. The number of first switches $SW_A$ may be any number, but it is preferable that the number is the same as that of the signal line S.

A switch terminal $T_A$ serving as a fourth terminal is coupled to a coupling line $L_A$. The coupling line $L_A$ extends from a location in the outer peripheral area B1b coupled to the switch terminal $T_A$ to the inner peripheral area B1a, and extends in the third direction X1 in the inner peripheral area B1b. In the inner peripheral area B1a, the coupling line $L_A$ is coupled to the first switch $SW_A$. More in detail, the coupling line $L_A$ is coupled to a gate electrode Ga of the first switch $SW_A$. That is, in the first switch $SW_A$, the gate electrode Ga is coupled to the switch terminal $T_A$ via the coupling line $L_A$. The coupling line $L_A$ is coupled to each gate electrode Ga of the first switches $SW_A$. In FIG. 4, the coupling line $L_A$ is coupled to each gate electrode Ga of the first switches $SW_{A1}$, $SW_{A2}$, $SW_{A3}$, $SW_{A4}$, $SW_{A5}$ and $SW_{A6}$. That is, one coupling line $L_A$ is coupled to each of the first switches $SW_A$.

In this manner, in the first switch $SW_A$, the drain electrode Dr is coupled to the output terminal T0 via the coupling line L0, the source electrode So is coupled to the signal line S via the video line V, and the gate electrode Ga is coupled to the switch terminal $T_A$ via the coupling line $L_A$. Thus, in the first switch $SW_A$, when a current (gate signal) is supplied to the gate electrode Ga via the switch terminal $T_A$, the coupling line L0 and the video line V, that is, the output terminal T0 and the signal line S, are electrically coupled to each other. On the other hand, in the first switch $SW_A$, while current (gate signal) is not supplied to the gate electrode Ga, the coupling line L0 and the video line V, that is, the output terminal T0 and the signal line S are electrically decoupled (disconnected) from each other. In this manner, the first switch $SW_A$ is configured to switch between the coupling and decoupling between the output terminal T0 (first terminal) and the signal line S. More specifically, in the first switch $SW_A$, the coupling and decoupling between the output terminal T0 serving as a first terminal and the signal line S are switched by the gate signal from the switch terminal $T_A$ (fourth terminal).

The second switch $SW_B$ is provided in the second peripheral area B2. That is, the second switch $SW_B$ is provided closer to the second direction Y2 than the first switch $SW_A$ provided in the first peripheral area B1 and the signal line S provided in the display area A. The second switch $SW_B$ is coupled to the signal lines S, and in the present embodiment, is coupled to two signal lines S. More specifically, in the second switch $SW_B$, the drain electrode Dr is coupled to one signal line S of the two signal lines S, and the source electrode So is coupled to the other signal line S of the two signal lines S. It is preferable that the second switch $SW_B$ is coupled to an end portion of each signal line S on the second direction Y2 side.

A plurality of second switches $SW_B$ are provided, and in the example of FIG. 4, there are second switches $SW_{B1}$, $SW_{B2}$, and $SW_{B3}$. In the second switch $SW_{B1}$, the drain electrode Dr is coupled to the signal line S1, and the source electrode So is coupled to the signal line S2. In the second switch $SW_{B2}$, the drain electrode Dr is coupled to the signal line S3, and the source electrode So is coupled to the signal line S4. In the second switch $SW_{B3}$, the drain electrode Dr is coupled to the signal line S5, and the source electrode So is coupled to the signal line S6. In the second switches $SW_{B1}$, $SW_{B2}$, and $SW_{B3}$, the source electrode So and the drain electrode Dr may be provided reversely. The number of second switches $SW_B$ may be any number, but it is preferable that the number is the half of that of the signal lines S.

A switch terminal $T_B$ serving as a second terminal is coupled to a coupling line $L_B$. The coupling line $L_B$ extends from a location in the outer peripheral area B1b coupled to the switch terminal $T_B$ to the second peripheral area B2, via the inner peripheral area B1a and the fourth peripheral area B4 (or third peripheral area B3), and extends in the third direction X1 in the second peripheral area B2. In the second peripheral area B2, the coupling line $L_B$ is coupled to the second switch $SW_B$. More in detail, the coupling line $L_B$ is coupled to the gate electrode Ga of the second switch $SW_B$. That is, in the second switch $SW_B$, the gate electrode Ga is coupled to the switch terminal $T_B$ via the coupling line $L_B$. The coupling line $L_B$ is coupled to each gate electrode Ga of a plurality of the second switches $SW_B$. In FIG. 4, the coupling line $L_D$ is coupled to each gate electrode Ga of the second switches $SW_{B1}$, $SW_{B2}$, and $SW_{B3}$. That is, one coupling line $L_B$ is coupled to each of the second switches $SW_B$.

In this manner, in the second switch $SW_B$, the drain electrode Dr is coupled to one of the two signal lines S, the source electrode So is coupled to the other of the two signal lines S, and the gate electrode Ga is coupled to the switch terminal $T_B$ via the coupling line $L_B$. Thus, in the second switch $SW_B$, when a current (gate signal) is supplied to the gate electrode Ga via the switch terminal $T_B$, the two signal lines S are electrically coupled to each other. On the other hand, in the second switch $SW_B$, while current (gate signal) is not supplied to the gate electrode Ga, the two signal lines S are electrically decoupled (disconnected) from each other. In this manner, the second switch $SW_B$ is coupled to the switch terminal $T_B$ (second terminal) and the signal line S, and is configured to switch between the coupling and decoupling between the signal lines S, according to the gate signal from the switch terminal $T_B$.

The third switch $SW_C$ is provided in the first peripheral area B1, and on the side opposite to the display area A than the driver terminal D (the first direction Y1 side). That is, the third switch $SW_C$ is provided in the outer peripheral area B1b, and on the side opposite to the display area A with respect to the driver terminal D (the first direction Y1 side of the driver terminal D). Thus, it can be said that in the direction Y, the driver terminal D is provided between the first switch $SW_A$ and the third switch $SW_C$.

The third switch $SW_C$ is coupled to the driver terminals D via wiring R. In the present embodiment, the third switch $SW_C$ is coupled to the two driver terminals D. In the example of FIG. 4, as the third switch $SW_C$, a third switch $SW_{C1}$ coupled to the driver terminals D1 and D2, a third switch $S_{C2}$ coupled to the driver terminals D3 and D4, and a third switch $SW_{C3}$ coupled to the driver terminals D5 and D6 are illustrated. It can be said that the third switch $SW_C$ is coupled to the video line V via the driver terminal D. More specifically, in the third switch $SW_C$, the drain electrode Dr is coupled to one driver terminal D of the two driver terminals D, and the source electrode So is coupled to the other driver terminal D of the two driver terminals D. In the example of FIG. 4, in the third switch $SW_{C1}$, the drain electrode Dr is coupled to the driver terminal D1, and the source electrode So is coupled to the driver terminal D2. However, in the third switch $SW_C$, the source electrode So and the drain electrode Dr may be provided reversely. A plurality of third switches $SW_C$ are provided. The number of third switches $SW_C$ may be any number, but it is preferable that the number is the half of that of the driver terminals D.

A switch terminal $T_C$ serving as a third terminal is coupled to a coupling line $L_C$. In the outer peripheral area B1b, the coupling line $L_C$ extends in the third direction X1. In the outer peripheral area B1b, the coupling line $L_C$ is coupled to the third switch $SW_C$. More in detail, the coupling line $L_C$ is coupled to the gate electrode Ga of the third switch $SW_C$. That is, in the third switch $SW_C$, the gate electrode Ga is coupled to the switch terminal T(via the coupling line $L_C$. The coupling line $L_C$ is coupled to each gate electrode Ga of a plurality of the third switches $SW_C$. That is, one coupling line $L_C$ is coupled to each of the third switches $SW_C$.

In this manner, in the third switch $SW_C$, the drain electrode Dr is coupled to one of the two driver terminals D, the source electrode So is coupled to the other of the two driver terminals D, and the gate electrode Ga is coupled to the switch terminal $T_C$ via the coupling line $L_C$. Thus, in the third switch $SW_C$, when a current (gate signal) is supplied to the gate electrode Ga via the switch terminal $T_C$, the two driver terminals D, that is, the two video lines V are electrically coupled to each other. On the other hand, in the third switch SWc, while current (gate signal) is not supplied to the gate electrode Ga, the two driver terminals D (two video lines V) are electrically decoupled (disconnected) from each other. In this manner, the third switch $SW_B$ is coupled to the switch terminal $T_C$ (third terminal) and the driver terminal D, and is configured to switch between the coupling and decoupling between the driver terminals D, according to the gate signal from the switch terminal $T_C$.

Inspection Method

Figure 5:
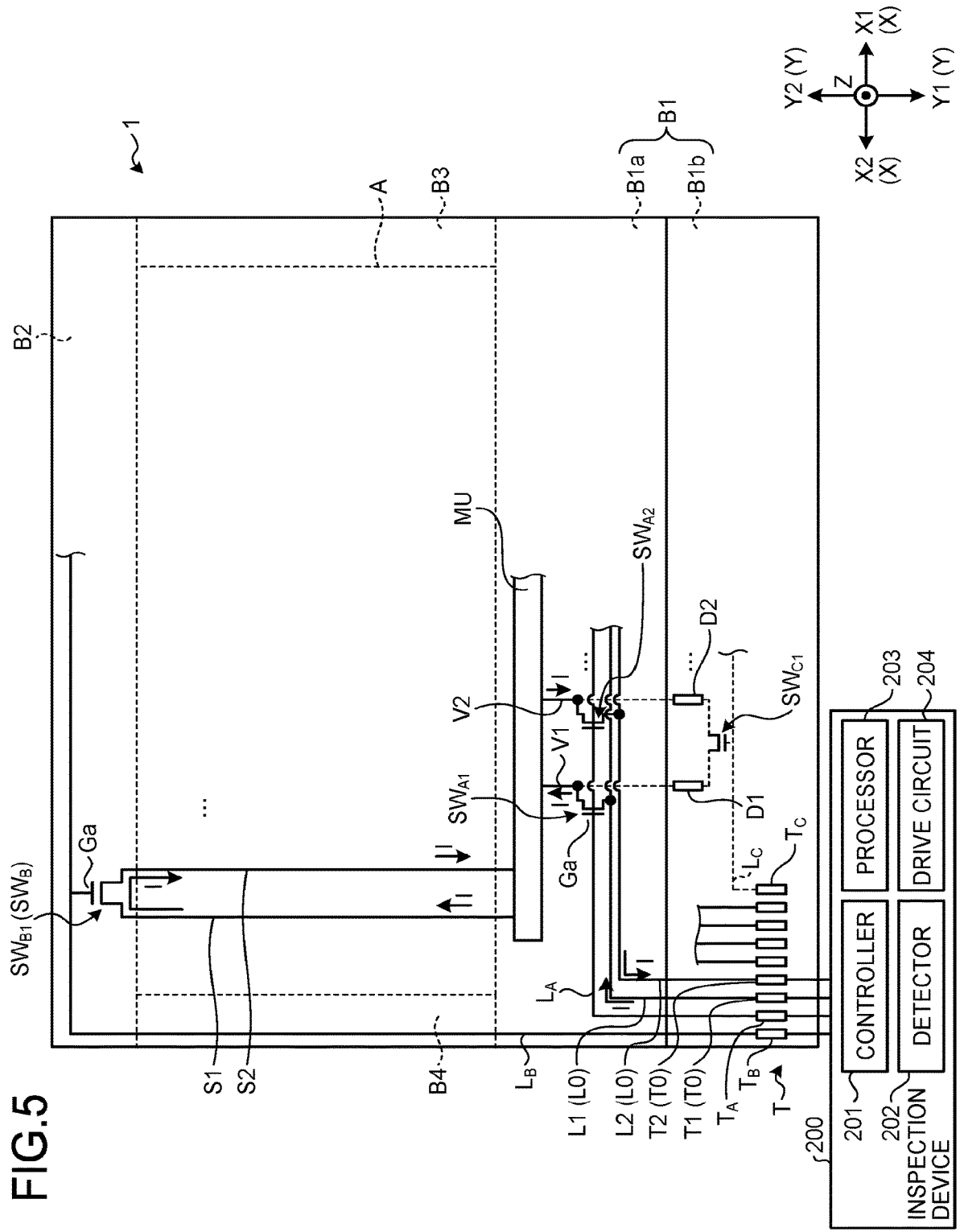
FIG. 5 is a schematic diagram illustrating an example of an aging treatment.
Figure 6:
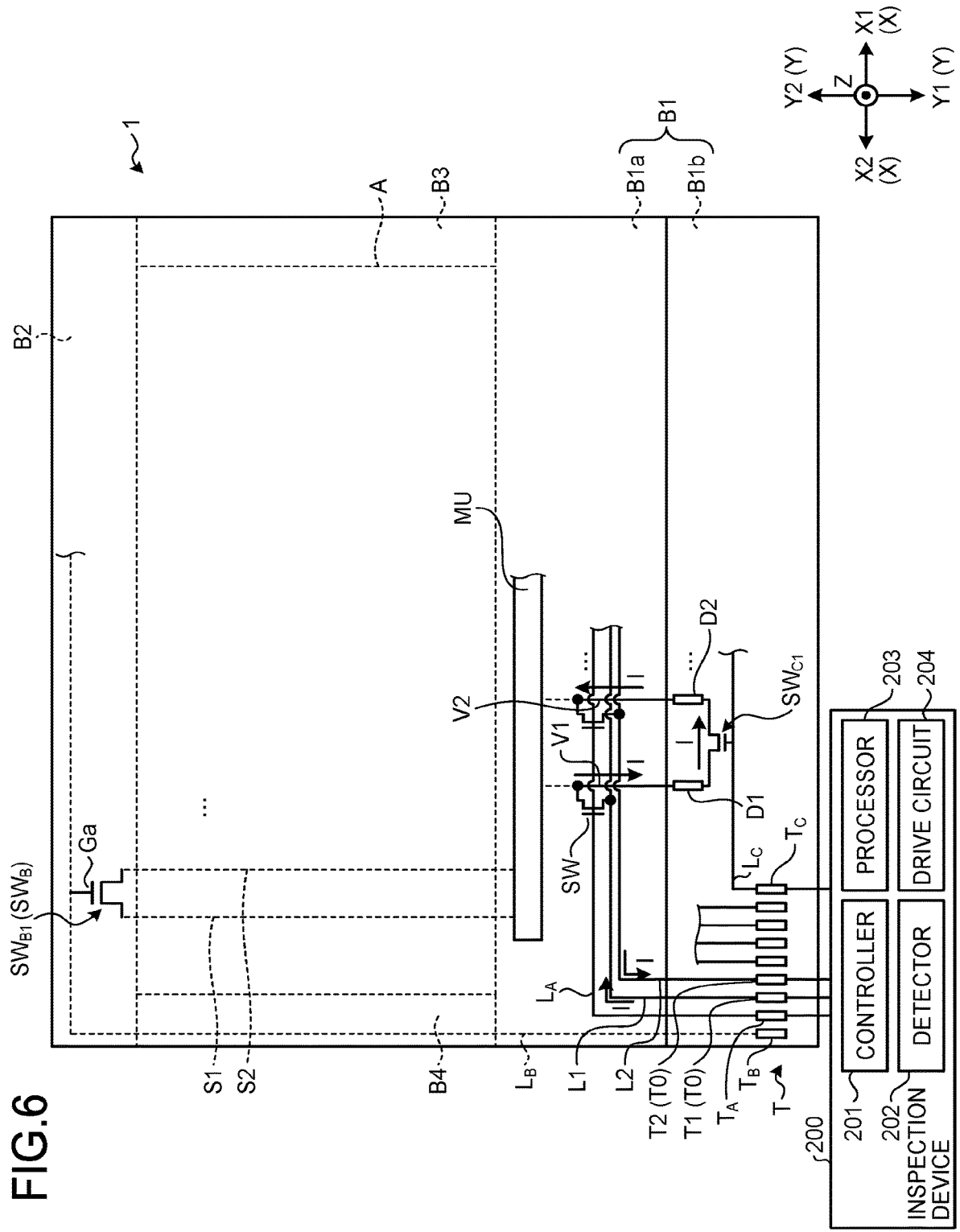
FIG. 6 is a schematic diagram illustrating an example of the aging treatment.

The display device 1 is configured as described above. Next, a method for inspecting wiring in the display device 1, that is, an aging treatment will be described. FIG. 5 and FIG. 6 are each a schematic diagram illustrating an example of the aging treatment. When the aging treatment is performed, the driver IC 110 is not coupled to the driver terminal D, and a signal from the driver IC 110 will not be supplied to the driver terminal D. However, as long as a signal from the driver IC 110 is not supplied to the driver terminal D, the driver IC 110 may be coupled to the driver terminal D.

FIG. 5 is an example of performing the aging treatment by driving the first switch $SW_A$ and the second switch $SW_B$. For the sake of convenience of explanation, in the example, the aging treatment is performed only on the signal lines S1 and S2. As illustrated in FIG. 5, when the aging treatment is to be performed, an inspection device 200 is coupled to the inspection terminal T. The inspection device 200 includes a controller 201, a detector 202, a processor 203, and a drive circuit 204. The inspection device 200 is merely an example, and may not include part of the functions, or may include other functions. The driver IC 110 (see FIG. 1) may include part of the functions of the inspection device 200.

The controller 201 is a circuit for inspecting the display device 1, by controlling the detector 202, the processor 203, and the drive circuit 204. The detector 202 is a circuit for detecting a signal output from the signal line S (in this example, current I). For example, the detector 202 is a voltage detection circuit, a current detection circuit, and the like. The processor 203 is a determination circuit for determining short circuit, disconnection, and the like of the signal line S, on the basis of the detection signal from the detector 202. The drive circuit 204 generates a gate signal for driving a switch, and an inspection signal for causing the current I to flow through the signal line S, and outputs the generated signals to the display device 1.

As illustrated in FIG. 5, when the aging treatment is performed by driving the first switch $SW_A$ and the second switch $SW_B$, the inspection device 200 is coupled to the switch terminal $T_A$, the switch terminal $T_B$, and the output terminal T0. In the actual inspection, it is preferable to couple the inspection device 200 to all the output terminals T0. However, in the example of FIG. 5, for the sake of convenience of explanation, the inspection device 200 is coupled to the output terminals T1 and T2.

The inspection device 200 outputs the gate signal to the switch terminal $T_A$ and the switch terminal $T_B$ from the drive circuit 204. The gate signal is a current having a certain potential, preferably at a certain fixed potential. The inspection device 200 keeps outputting the gate signal to the switch terminal $T_A$ and the switch terminal $T_B$ during a predetermined period, that is, a period during which the aging treatment is performed. The gate signal output to the switch terminal $T_A$ is supplied to the gate electrode Ga of the first switch $SW_A$ via the coupling line $L_A$. When the gate signal is supplied to the gate electrode Ga, the first switch $SW_A$ couples the coupling line L0 and the video line V, that is, the output terminal T0 and the signal line S. In the example of FIG. 5, the first switch $SW_{A1}$ couples the coupling line L1 and the video line V1, and the first switch $SW_{A2}$ couples the coupling line L2 and the video line V2. On the other hand, the gate signal output to the switch terminal $T_B$ is supplied to the gate electrode Ga of the second switch $SW_B$ via the coupling line $L_B$. When the gate signal is supplied to the gate electrode Ga, the second switch $SW_B$ couples the signal lines S to each other, that is, in the example of FIG. 5, couples the signal line S1 and the signal line S2. Consequently, a closed circuit is formed by the inspection device 200, the output terminal T1, the coupling line L1, the first switch $SW_{A1}$, the video line V1, the signal line S1, the second switch $SW_{B1}$, the signal line S2, the video line V2, the first switch $SW_{A1}$, the coupling line L2, and the output terminal T2.

The inspection device 200 outputs the inspection signal to the output terminal T0 from the drive circuit 204. The inspection signal is a current at a predetermined potential. The inspection device 200 outputs inspection signals at different potentials, to the output terminals T0 forming a pair. It is preferable that the inspection device 200 outputs inspection signals having potentials of opposite polarities, to the output terminals T0 forming a pair. The output terminals T0 forming a pair indicate two output terminals T0 coupled to each of the two signal lines S to which the same second switch $SW_B$ is coupled. In the example of FIG. 5, the output terminals T0 forming a pair are the output terminal T1 and the output terminal T2. In the example of FIG. 5, the inspection device 200 outputs an inspection signal having a potential of positive polarity to the output terminal T1, and outputs an inspection signal having a potential of negative polarity to the output terminal T2. As described above, a closed circuit is formed by the first switch $SW_A$ and the second switch $SW_B$. Thus, due to a potential difference between the inspection signal in the output terminal T1 and the inspection signal in the output terminal T2, the current I flows from the output terminal T1 through the coupling line L1, the first switch $SW_{A1}$, the video line V1, the signal line S1, the second switch $SW_{B1}$, the signal line S2, the video line V2, the first switch $SW_{A2}$, the coupling line L2, and the output terminal T2, in this order. For example, the inspection device 200 allows a large current I to flow, by setting the potential difference between the output terminal T1 and the output terminal T2 high to tens of volts and the like, and applying a high voltage to both ends of a passage between the output terminal T1 and the output terminal T2. The potential difference of the voltage applied to both ends of the passage between the output terminal T1 and the output terminal T2 is set so as to be at least twice larger than the potential difference between the video signal from the driver IC 110 and the common signal (maximum amplitude of the video signal). In the inspection device 200, the polarities of the inspection signals to be output to the output terminal T1 and the output terminal T2 may be switched every time a predetermined time has elapsed. Consequently, it is possible to reverse the direction of the current I made to flow at predetermined intervals.

In the aging treatment illustrated in FIG. 5, the current I is made to flow through the signal line S1 and the signal line S2 as described above. For example, if there is a partially disconnected part, that is, if there is a location where the line width is locally narrowed in the signal line S, it is possible to disconnect the location. By breaking the line and detecting a break in the line before shipping the display device 1, it is possible to suppress disconnection after the display device 1 is shipped, and improve reliability. For example, when a video signal is output to the signal line S in the lighting inspection and the like after the aging treatment is performed, the disconnected location will not be displayed in color. Thus, for example, it is possible to visually detect the disconnection of the signal line S. For example, when the signal line S is disconnected in the aging treatment, current does not flow. Thus, it is possible to detect whether the signal line S is disconnected, by detecting the fact that the current and voltage are not flowing, using the detector 202 and the processor 203. In this manner, when the aging treatment illustrated in FIG. 5 is performed, it is possible to detect whether there is a partially disconnected part in the signal line S. In the aging treatment illustrated in FIG. 5, the current I also flows through a section from the first switch $SW_A$ to the coupling circuit MU of the video line V (video lines V1 and V2). Thus, it is also possible to detect whether there is a partially disconnected part in the section from the first switch $SW_A$ to the coupling circuit MU of the video line V, in addition to the signal line S.

In the aging treatment in FIG. 5, the gate signal is not output to the switch terminal $T_C$, so the driver terminals D are disconnected from each other. Thus, the current I does not flow through a section from the first switch $SW_A$ to the driver terminal D of the video line V. However, as illustrated in FIG. 6, when the aging treatment is performed by driving the first switch $SW_A$ and the third switch $SW_C$, it is possible to detect a partially disconnected part in this section, by causing the current I to flow through the section from the first switch $SW_A$ to the driver terminal D of the video line V. The detailed description will follow.

As illustrated in FIG. 6, when the aging treatment is performed by driving the first switch $SW_A$ and the third switch $SW_C$, the inspection device 200 is coupled to the switch terminal $T_A$, the switch terminal $T_C$, and the output terminal T0. In the actual inspection, it is preferable to couple the inspection device 200 to all the output terminals T0. However, in the example of FIG. 6, the inspection device 200 is coupled to the output terminals T1 and T2.

The inspection device 200 outputs the gate signal to the switch terminal $T_A$ and the switch terminal $T_C$ from the drive circuit 204. The inspection device 200 keeps outputting the gate signal to the switch terminal $T_A$ and the switch terminal $T_C$ during a predetermined period, that is, a period during which the aging treatment is performed. The gate signal output to the switch terminal $T_A$ is supplied to the gate electrode Ga of the first switch $SW_A$ via the coupling line $L_A$. When the gate signal is supplied to the gate electrode Ga, the first switch $SW_A$ couples the coupling line L0 and the video line V, that is, the output terminal T0 and the signal line S. In the example of FIG. 5, the first switch $SW_{A1}$ couples the coupling line L1 and the video line V1, and the first switch $SW_{A2}$ couples the coupling line L2 and the video line V2. On the other hand, the gate signal output to the switch terminal $T_C$ is supplied to the gate electrode Ga of the third switch $SW_{C1}$ via the coupling line $L_C$. When the gate signal is supplied to the gate electrode Ga, the third switch $SW_{C1}$ couples the driver terminals D to each other, that is, in the example of FIG. 6, couples the driver terminal D1 and the driver terminal D2. Consequently, a closed circuit is formed by the inspection device 200, the output terminal T1, the coupling line L1, the first switch $SW_{A1}$, the video line V1, the driver terminal D1, the third switch $SW_{C1}$, the driver terminal D2, the video line V2, the first switch $SW_{A2}$, the coupling line L2, and the output terminal T2.

The inspection device 200 outputs the inspection signal to the output terminal T0 from the drive circuit 204. Similar to the aging treatment in FIG. 5, the inspection device 200 outputs inspection signals at different potentials, to the output terminals T1 and T2 forming a pair. In the example of FIG. 5, the inspection device 200 outputs an inspection signal having a potential of positive polarity to the output terminal T1, and outputs an inspection signal having a potential of negative polarity to the output terminal T2. As described above, a closed circuit is formed by the first switch $SW_A$ and the third switch $SW_C$. Thus, due to a potential difference between the inspection signal in the output terminal T1 and the inspection signal in the output terminal T2, the current I flows from the output terminal T1 through the coupling line L1, the first switch $SW_{A1}$, the video line V1, the driver terminal D1, the third switch $SW_C$, the driver terminal D2, the video line V2, the first switch $SWA_2$, the coupling line L2, and the output terminal T2, in this order.

In the aging treatment illustrated in FIG. 6, the current I flows through the section from the first switch $SW_A$ to the driver terminal D of the video line V. Thus, it is possible to detect a partially disconnected part in this section. In the aging treatment in FIG. 6, since the gate signal is not output to the switch terminal $T_D$, the driver terminals D are disconnected from each other. Thus, the current I does not flow through the signal line S, and the section from the first switch $SW_A$ to the coupling circuit MU of the video line V.

When the aging treatment is finished, it is preferable to close the inspection terminal T before the display device 1 is shipped. When the aging treatment is finished, it is preferable to treat the display device 1 so that current will not flow into the gate electrode Ga, to prevent the first switch $SW_A$, the second switch $SW_B$, and the third switch $SW_C$ from being driven, before the display device 1 is shipped.

In this manner, in the present embodiment, the aging treatment is performed by driving the first switch $SW_A$ and the second switch $SW_B$ as illustrated in FIG. 5, and the aging treatment is performed by driving the first switch $SW_A$ and the third switch $SW_C$ as illustrated in FIG. 6. Thus, it is possible to detect a partially disconnected part of the video line V, in addition to the signal line S. However, by performing the aging treatment in FIG. 5, it is possible to detect a partially disconnected part of the signal line S. Thus, the aging treatment in FIG. 6 is not always necessary. In this case, in the display device 1, the switch terminal $T_C$, the third switch $SW_C$, the coupling line $L_C$, and the wiring R may not be provided. When the aging treatment in FIG. 6 is not performed, for example, a partial disconnection may be detected by an optical inspection, for the section from the first switch $SW_A$ to the driver terminal D of the video line V. By performing the aging treatment as in FIG. 5, it is possible to reduce a range of optical inspection.

As described above, the display device 1 according to the present embodiment includes the first substrate SUB1, the signal line S (wiring), the output terminal T0 (first terminal), the switch terminal $T_B$ (second terminal), the driver terminal D, the first switch $SW_A$, and the second switch $SW_B$. The first substrate SUB1 includes the display area A in which the pixels PX are provided, and the peripheral area B outside of the display area A. The signal line S is provided in the display area A, is coupled to the pixels PX, and supplies signals to the pixels PX. The output terminal T0 and the switch terminal $T_B$ are provided in the peripheral area B. The driver terminal D is provided in the first peripheral area B1 that is the peripheral area B on the first direction Y1 side of the display area A, coupled to the signal line S, and to which the driver IC 110 can be coupled. The first switch $SW_A$ is provided in the first peripheral area B1, closer to the display area A than the driver terminal D, and is configured to switch between the coupling and decoupling between the output terminal T0 and the signal line S. The second switch $SW_B$ is provided in the second peripheral area B2 that is the peripheral area B on the second direction Y2 side of the display area A, and is coupled to the switch terminal $T_B$ and the signal line S.

With the display device 1 according to the present embodiment, the current I for inspection from the output terminal T0 can be made to flow through the signal line S, by driving the first switch $SW_A$ and the second switch $SW_B$. Thus, the display device 1 can detect whether there is a partially disconnected part (location where the line width is locally narrowed), that is, a location where disconnection may occur, in the signal line S. Thus, with the display device 1, it is possible to suppress deterioration in reliability. In the display device 1, the first switch $SW_A$ is disposed closer to the display area A than the driver terminal D. Thus, for example, if there is a fault in the driver terminal D and the driver IC 110, but if there is no fault in the circuit closer to the display area A than the driver terminal D, only the circuit on the driver terminal D side and the driver IC 110 side may be removed. That is, in this case, by leaving the main portion of the display device 100 closer to the display area A than the driver terminal D and the driver IC 110, including the first switch $SW_A$ and the like, the display device 1 can be reused. By disposing the first switch $SW_A$ closer to the display area A than the driver terminal D, there is no need to directly couple the coupling lines $L_A$ and L0 to the driver terminal D, for the aging treatment. Consequently, for example, when the device has a COE structure, it is possible to suppress the wiring from being overlapped with the driver IC 110, and suppress intrusion of noise.

A plurality of signal lines S are provided, and the second switch $SW_B$ is configured to switch between the coupling and decoupling between the signal lines S, according to the gate signal from the switch terminal $T_B$ (second terminal). With the display device 1, it is possible to detect a partial disconnection of the signal lines S by a single aging treatment, by allowing the signal lines S to be coupled to each other.

The display device 1 also includes the switch terminal $T_C$ (third terminal) provided in the peripheral area B, and the third switch $SW_C$ that is provided in the first peripheral area B1 on the side opposite to the display area A with respect to the driver terminal D, and that is coupled to the switch terminal $T_C$ and the driver terminal D. The display device 1 also includes the switch terminal $T_C$ and the third switch $SW_C$, in addition to the first switch $SW_A$ and the second switch $SW_B$. Thus, with the display device 1, it is possible to detect a partial disconnection of the other wiring (in this example, the section from the first switch $SW_A$ to the driver terminal D of the video line V) coupled to the driver terminal D, in addition to the signal line S. However, as described above, the switch terminal $T_C$ and the third switch $SW_C$ may not be provided.

A plurality of driver terminals D are provided, and the third switch $SW_C$ is configured to switch between the coupling and decoupling between the driver terminals D, according to the gate signal from the switch terminal Tc (third terminal). With the display device 1, it is possible to preferably detect a partial disconnection of the other wiring coupled to the driver terminal D.

The display device 1 further includes the switch terminal $T_A$ (fourth terminal) provided in the peripheral area B and coupled to the first switch $SW_A$. The first switch $SW_A$ switches between the coupling and decoupling between the output terminal T0 and the signal line S, according to the gate signal from the switch terminal $T_A$. With the display device 1, it is possible to preferably detect a partial disconnection of the signal line S.

The display device 1 also includes the second substrate SUB2 provided opposite to the first substrate SUB1. The display area A and a part of the first peripheral area B1 (inner peripheral area B1a) are provided in an area where the first substrate SUB1 and the second substrate SUB2 are overlapped with each other (overlapping area AR1). The first switch $SW_A$ is provided in the first peripheral area B1, in an area where the first substrate SUB1 and the second substrate SUB2 are overlapped with each other, that is, in the inner peripheral area B1a. Because the first switch $SW_A$ is provided in the inner peripheral area B1a, when there is a fault in the driver terminal D and the driver IC 110, the display device 1 can be preferably reused.

The output terminal T0 (first terminal) and the switch terminal $T_B$ (second terminal) are provided in the first peripheral area B1. By providing the output terminal T0 and the switch terminal $T_B$ in the first peripheral area B1 the same as that of the driver terminal D, it is possible to easily perform the aging inspection.

Modification

Figure 7:
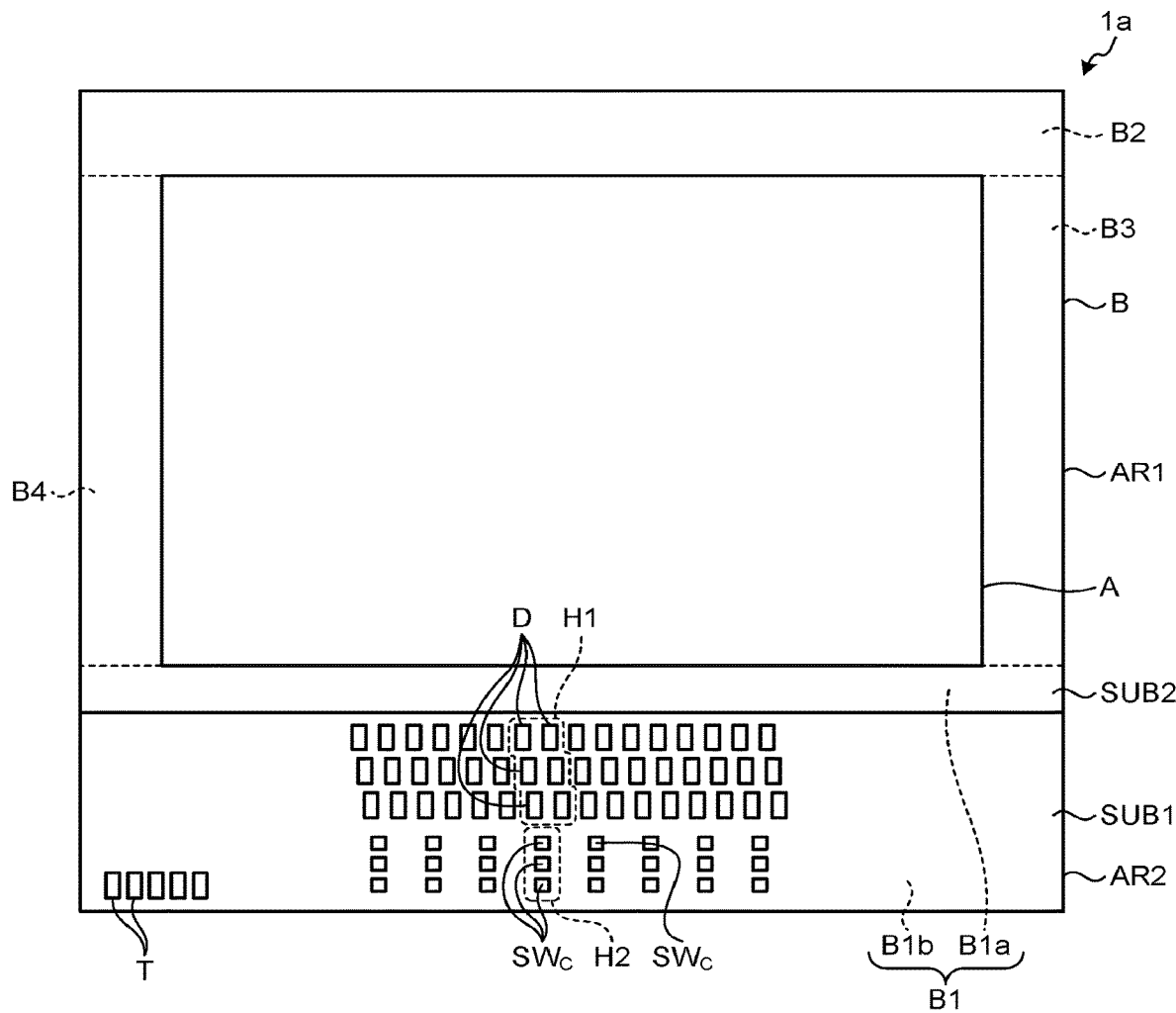
FIG. 7 is a plan view schematically illustrating a display device according to a modification.

Next, a modification of the present embodiment will be described. FIG. 7 is a plan view schematically illustrating a display device according to a modification. As illustrated in FIG. 7, in a display device 1a according to the modification, the arrangement of the driver terminal D and the third switch $SW_C$ is different from that in the embodiment described above. In FIG. 7, for the sake of convenience of explanation, the third switch $SW_C$ is illustrated. However, in practice, the third switch $SW_C$ is not exposed to outside, and is provided inside the first substrate SUB1.

As illustrated in FIG. 7, the driver terminals D are arranged in a matrix (row-column configuration) in the first direction Y1 and the third direction X1. That is, the driver terminals D are arranged in the first direction Y1, and are arranged in the third direction X1. The driver terminals D that are arranged in the first direction Y1 are shifted along the third direction X1. That is, the driver terminals D arranged in the third direction X1 in a predetermined row (for example, the first row) are shifted along the third direction X1, with respect to the driver terminals D1 arranged in the third direction X1, in the row (for example, the second row) on the first direction Y1 side of the predetermined row. In the example of FIG. 7, the driver terminals D are formed of three rows in the first direction Y1. The driver terminals D in the first row, the second row, and the third row are shifted from each other along the third direction X1. However, the number of rows of the driver terminals D is not limited to three, and may be any number as long as it is two or more. The number of driver terminals D arranged in the third direction X1 may be any number as long as it is two or more. The driver terminals D arranged in the third direction X1 in the same row are not shifted in the first direction Y1, but may be shifted in the first direction Y1.

The third switches $SW_C$ are arranged along the first direction Y1, and a plurality of columns of the third switches $SW_C$ arranged along the first direction Y1 are provided in the third direction X1. The third switches $SW_C$ arranged along the first direction Y1 are not shifted in the third direction X1, and the third switches $SW_C$ arranged along the third direction X1 are not shifted in the first direction Y1, but may be shifted.

In this example, among the driver terminals D, the driver terminals D arranged in the first direction Y1 and the third direction X1 are referred to as a driver terminal group H1. In the example of FIG. 7, the driver terminal group H1 is configured of three driver terminals D in the first direction Y1 and two driver terminals D in the third direction X1. That is, the driver terminal group H1 is configured of the driver terminals D of three times two, which is, six in total. The number of driver terminals D in the driver terminal group H1 may be any number as long as it is two or more, but it is preferable there are two driver terminals D in the third direction X1. Among the third switches $SW_C$, the third switches $SW_C$ arranged in the first direction Y1 are referred to as a third switch group H2. In the example of FIG. 7, the third switch group H2 is configured of three third switches $SW_C$ in the first direction Y1 and one third switch $SW_C$ in the third direction X1. That is, the third switch group H2 is configured of the third switches $SW_C$ of three times one, which is, three in total. In the first direction Y1, it is preferable that the number of the third switches $SW_C$ in the third switch group H2 is equivalent to the number of the driver terminal group H1 in the first direction Y1, and in the third direction X1, it is preferable that the number of the third switch $SW_C$ is one.

Figure 8:
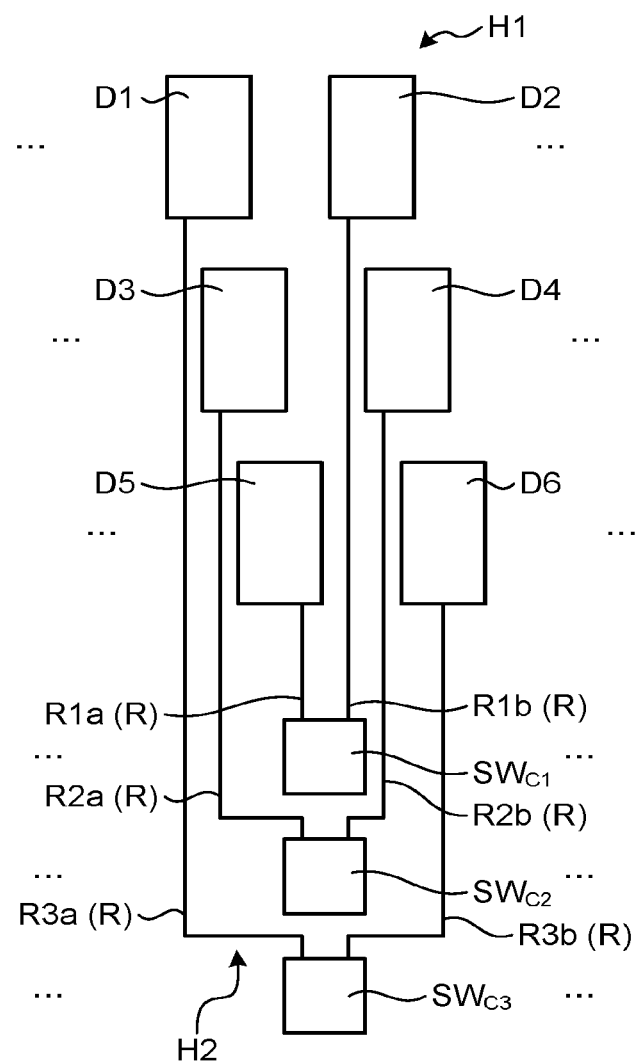
FIG. 8 is a schematic diagram illustrating a coupling example between a driver terminal and a third switch in the modification.

The driver terminal group H1 and the third switch group H2 that face each other in the first direction Y1 are coupled via the wiring R (see FIG. 4). FIG. 8 is a schematic diagram illustrating a coupling example between a driver terminal and a third switch in the modification. FIG. 8 illustrates the driver terminal group H1 and the third switch group H2 that face each other in the first direction Y1. As illustrated in FIG. 8, the driver terminal group H1 includes the driver terminals D1, D2, D3, D4, D5, and D6 as the driver terminals D. In the driver terminal group H1, the driver terminal D1 is located farthest on the second direction Y2 side and located farthest on the fourth direction X2 side. The driver terminal D2 is adjacent to the driver terminal D1 on the third direction X1 side. The driver terminal D3 is adjacent to the driver terminal D1 on the first direction Y1 side. The driver terminal D4 is adjacent to the driver terminal D3 on the third direction X1 side. The driver terminal D5 is adjacent to the driver terminal D3 on the first direction Y1 side. The driver terminal D6 is adjacent to the driver terminal D5 on the third direction X1 side.

More specifically, in the driver terminal group H1, the driver terminal D1, the driver terminal D3, the driver terminal D5, the driver terminal D2, the driver terminal D4, and the driver terminal D6 are arranged in this order in the third direction X1. Thus, in the driver terminal group H1, the driver terminals D1 and D6 are located on the outermost side in the third direction X1 (that is, located farthest on the third direction X1 side and farthest on the fourth direction X2 side). The driver terminals D2 and D5 are located on the innermost side in the third direction X1 (located closest to the center in the third direction X1 in an area where the driver terminal group H1 is provided).

The third switch group H2 includes the third switches $SW_{C1}$, $SW_{C2}$, and $SW_{C3}$ as the third switches $SW_C$. In the third switch group H2, the third switch $SW_{C1}$ is located farthest on the second direction Y2 side. The third switch $SW_{C2}$ is adjacent to the third switch $SW_{C1}$ on the first direction Y1 side. The third switch $SW_{C3}$ is adjacent to the third switch $SW_{C2}$ on the first direction Y1 side, and in the third switch group H2, is located farthest on the first direction Y1 side.

The driver terminals D and the third switches $SW_C$ arranged in this manner are coupled as follows. The third switch $SW_{C1}$ is coupled to the driver terminal D5 by wiring R1a, and is coupled to the driver terminal D2 by wiring R1b. That is, the third switch $SW_{C1}$ located farthest on the second direction Y2 side (the side closest to the driver terminal D) is coupled to the driver terminals D2 and D5 on the innermost side in the third direction X1. The third switch $SW_{C2}$ is coupled to the driver terminal D3 by wiring R2a, and is coupled to the driver terminal D4 by wiring R2b. The third switch $SW_3$ is coupled to the driver terminal D1 by wiring R3a, and is coupled to the driver terminal D6 by wiring R3b. That is, the third switch $SW_{C3}$ located farthest on the first direction Y1 side (the side farthest away from the driver terminal D) is coupled to the driver terminals D1 and D6 on the outermost side in the third direction X1.

As described above, the display device 1a according to the modification includes the driver terminal group H1 configured of the driver terminals D arranged in the first direction Y1 and the third direction X1, and the third switch group H2 configured of the third switches $SW_C$ arranged in the first direction Y1. The third switch group H2 is coupled to the driver terminal group H1. Because the driver terminals D and the third switches $SW_C$ are arranged in this manner, the display device 1a according to the modification can arrange a large number of driver terminals D and third switches $SW_C$ even in a narrow area.

In the driver terminal group H1, the driver terminals D arranged in the first direction Y1 are shifted along the third direction. The third switch $SW_C$ located farthest on the first direction Y1 side in the third switch group H2, is coupled to the driver terminals D on the outermost side in the third direction X1, in the driver terminal group H1. The third switch $SW_C$ located farthest on the second direction Y2 side is coupled to the driver terminals D on the innermost side in the third direction X1, in the driver terminal group H1. By coupling the driver terminals D and the third switch $SW_C$ in this manner, the display device 1a according to the modification can arrange the pieces of wiring R in a compact manner and without crossing each other.

Figure 9:
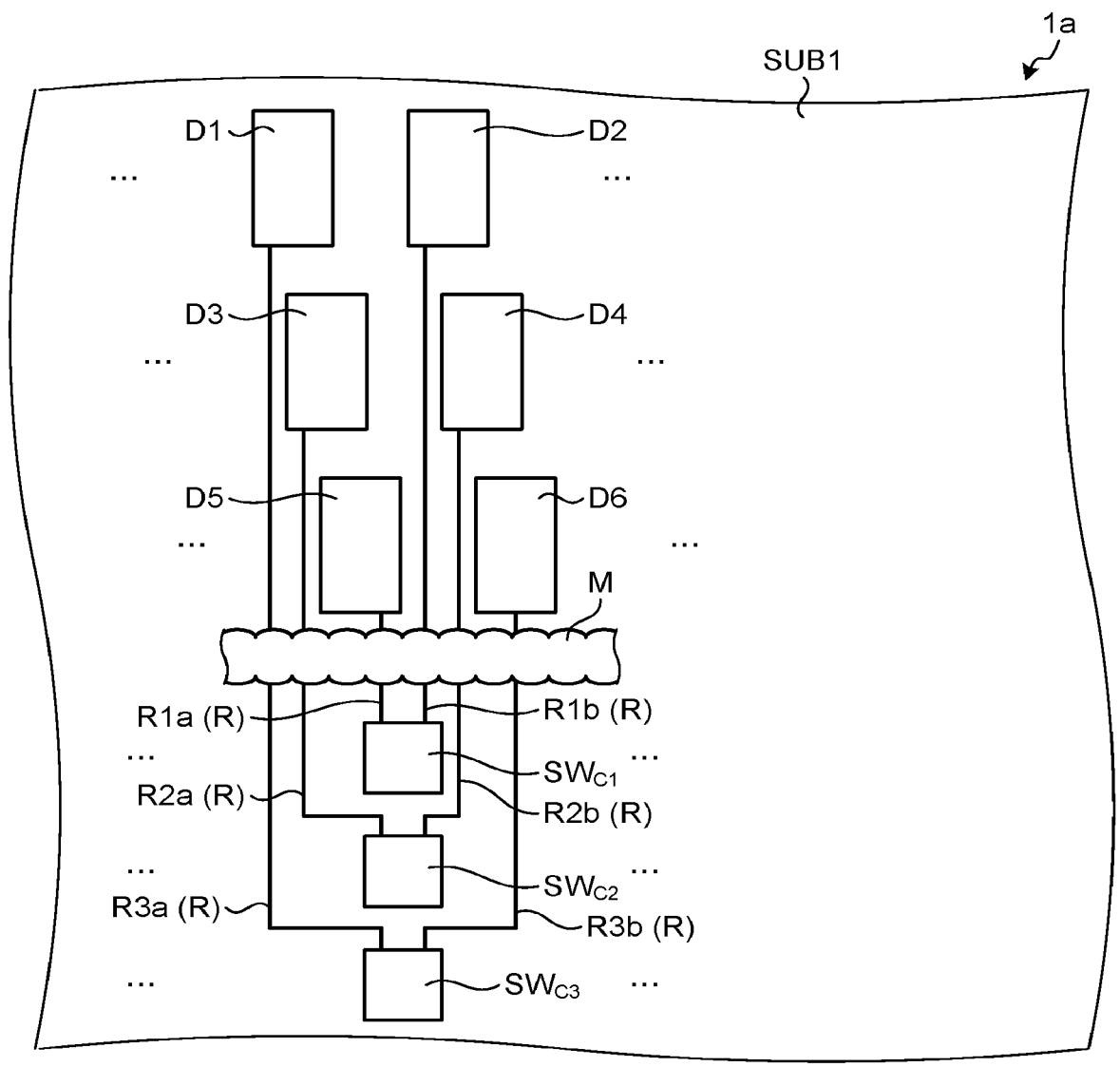
FIG. 9 is a schematic diagram illustrating the coupling example between the driver terminal and the third switch in the modification.

FIG. 9 is a schematic diagram illustrating the coupling example between the driver terminal and the third switch in the modification. After the aging treatment is finished, the display device 1a may cut the wiring R between the driver terminal D and the third switch $SW_C$ as illustrated in FIG. 9. In the display device 1a after the wiring R is cut in this manner, a cutting mark M is provided between the pieces of wiring R. The cutting mark M is a mark left on the first substrate SUB1, and is an area where the wiring R is not provided. For example, when the wiring R is cut by laser, the cutting mark M will be a laser mark. The wiring R is not only cut in the display device 1a of the modification, but may also be cut in the display device 1 of the embodiment as illustrated in FIG. 4 and the like. That is, the cutting mark M may also be provided in the display device 1.

In this manner, the cutting mark M is provided in the display devices 1 and 100a, between the wiring R coupled to the driver terminal D and the wiring R coupled to the third switch $SW_C$. The wiring R coupled to the driver terminal D and the wiring R coupled to the third switch $SW_C$ are disconnected from each other with the cutting mark M interposed therebetween. In this manner, by cutting the wiring R between the driver terminal D and the third switch $SW_C$, and disconnecting the driver terminal D and the third switch $SW_C$, it is possible to suppress the malfunction of the third switch $SW_C$ after the aging treatment is performed, and suppress the coupling of the driver terminals D to each other. There is also no need to treat the display device so that a signal is not supplied to the gate electrode Ga of the third switch $SW_C$, after the aging treatment.

Other functions and effects brought about by the aspects described in the present embodiment, that are apparent from the description of the present specification, or that can be easily assumed by those skilled in the art, are naturally understood to be brought about by the present invention.

What is claimed is:

1. A display device, comprising:
   a first substrate having a display area in which a plurality of pixels are arranged and a peripheral area outside of the display area;
   wiring provided in the display area and coupled to the pixels to supply a signal to the pixels;
   a first terminal, a second terminal, and a third terminal provided in the peripheral area;
   a driver terminal provided in a first peripheral area that is the peripheral area on a first direction side of the display area, and coupled to the wiring to allow a driver IC to be coupled to a driver;
   a first switch provided in the first peripheral area closer to the display area than the driver terminal, the first switch being configured to switch between coupling and decoupling between the first terminal and the wiring;
   a second switch provided in a second peripheral area that is the peripheral area on a second direction side in a direction opposite to the first direction of the display area, and coupled to the second terminal and the wiring;
   a third switch provided in the first peripheral area on a side opposite to the display area with respect to the driver terminal, and coupled to the third terminal and the driver terminal;
   a driver terminal group of a plurality of the driver terminals arranged in the first direction and in a third direction orthogonal to the first direction; and
   a third switch group of a plurality of the third switches arranged in the first direction,
   wherein
   the third switch group is coupled to the driver terminal group, in the driver terminal group, the driver terminals arranged in the first direction are shifted along the third direction, and in the third switch group, the third switch located farthest on the first direction side is coupled to the driver terminal at an outermost side in the third direction, in the driver terminal group, and the third switch located farthest on the second direction side is coupled to the driver terminal at an innermost side in the third direction, in the driver terminal group.

2. The display device according to claim 1, wherein the wiring to be provided includes a plurality of pieces of wiring, and the second switch is configured to switch between coupling and decoupling between the pieces of wiring according to a signal from the second terminal.

3. The display device according to claim 1, wherein the driver terminal to be provided includes a plurality of driver terminals; and the third switch is configured to switch between coupling and decoupling between the driver terminals according to a signal from the third terminal.

4. The display device according to claim 1, further comprising a fourth terminal provided in the peripheral area and coupled to the first switch, wherein the first switch switches between coupling and decoupling between the first terminal and the wiring according to a signal from the fourth terminal.

5. The display device according to claim 1, further comprising a second substrate provided opposite to the first substrate and having an area overlapped with the first substrate in which the display area and a part of the first peripheral area are provided, wherein the first switch is provided in the part of the first peripheral area, and in the part of the first peripheral area the first substrate and the second substrate are overlapped with each other.

6. The display device according to claim 1, wherein the first terminal and the second terminal are provided in the first peripheral area.

7. The display device according to claim wherein a cutting mark is provided between wiring coupled to the driver terminal and wiring coupled to the third switch, and the wiring coupled to the driver terminal and the wiring coupled to the third switch are disconnected from each other with the cutting mark interposed therebetween.

* * * * *